United States Patent
Wu et al.

(10) Patent No.: US 7,843,263 B2
(45) Date of Patent: Nov. 30, 2010

(54) POWER AMPLIFIER WITH NOISE SHAPING FUNCTION

(75) Inventors: Kuo-Hung Wu, Sinshih Township, Tainan County (TW); Jun-Nian Lin, Fongshan (TW); Zhi-Yu Zhuang, Taipei (TW)

(73) Assignee: Himax Analogic, Inc., Tainan County (TW)

( * ) Notice: Subject to any disclaimer, the term of this patent is extended or adjusted under 35 U.S.C. 154(b) by 334 days.

(21) Appl. No.: 11/759,945

(22) Filed: Jun. 8, 2007
(Under 37 CFR 1.47)

(65) Prior Publication Data
US 2008/0303590 A1   Dec. 11, 2008

(51) Int. Cl.
*H03F 3/217* (2006.01)
(52) U.S. Cl. .......................................... 330/251; 330/10
(58) Field of Classification Search .................... 330/10, 330/207 A, 251
See application file for complete search history.

(56) References Cited

U.S. PATENT DOCUMENTS 6,707,337 B2 * 3/2004 Noro ........................... 330/251
7,339,425 B2 * 3/2008 Yang ........................... 330/251

OTHER PUBLICATIONS

"Microelectronic Circuits (fourth version)", Adel S, Sedra & kenneth C. Smith, Paragraph 2 of Chapter 8, [670-674].
"Microelectronic Circuits (fourth version)", Adel S, Sedra & kenneth C. Smith, Paragraph 2 of Chapter 8, [670-674], 1998.

* cited by examiner

*Primary Examiner*—Khanh V Nguyen
(74) *Attorney, Agent, or Firm*—Jianq Chyun IP Office

(57) ABSTRACT

A power amplifier with noise shaping function is provided. The power amplifier includes a differential mode integrator, an integration and adjustment unit and a switch unit. The differential mode integrator is used for receiving a differential mode input signal and a differential mode output signal, and outputting a differential mode first signal. The integration and adjustment unit is coupled to the differential mode integrator for receiving the first signal and an output signal and outputting a single-end mode second signal. The switch unit is used for receiving the second signal and outputting the differential mode output signal to drive the load. The present invention uses a common mode input signal instead of the single-end input signal to eliminate the common mode noise, and uses a $2^{nd}$-order (or more than that) integrating circuit instead of the conventional filter to achieve a preferred effect of reducing the off band noise.

16 Claims, 3 Drawing Sheets

US 7,843,263 B2

POWER AMPLIFIER WITH NOISE SHAPING FUNCTION

BACKGROUND OF THE INVENTION

1. Field of the Invention

The present invention relates to a power amplifier, and more particularly, to a power amplifier with noise shaping function.

2. Description of Related Art

Referring to FIG. 1, a common power amplifier, particularly, an audio power amplifier, adopts a negative feedback design to achieve a stable gain. Meanwhile, a low-pass filter is further connected in series to eliminate the high-frequency noise, wherein the low-pass filter is usually an integrating circuit. As shown in FIG. 1, a feedback circuit 110 converts output signals Vo1 and Vo2 into a single-end mode feedback signal Vsum_P. The feedback signal Vsum_P and the input signal VI pass through the integrator 120 to filter the noise.

However, since the amplifier has evolved from the vacuum tube to the transistor, noise interference has always been the largest problem suffered by the audio power amplifier. The main source of noises is divided into two types, wherein one is power supply hum. The output power amplification stage 130 withdraws a high current from the power supply end VDD, but the power supply end VDD cannot be effectively filtered. Therefore, when the gate signal is triggered, and requires a pure high current to passes through the power supply end VDD, the high current contains noises and is not pure, such that the noises are fed into the whole circuit through the feedback circuit 110. The above content can be obtained with reference to Paragraph 2 of Chapter 8 of "Microelectronic Circuit" (fourth version) written by Adel S. Sedra & Kenneth C. Smith. Therefore, the common solution is to add a filter in the feedback circuit 110 to eliminate noises. However, in such design, as shown in FIG. 1, the effect of eliminating noises by a conventional filter is not desirable.

The second source of noises is radio frequency interference. When a radio frequency signal gets close to the audio amplifier, the circuit with a relatively poor common mode rejection ratio receives the radio frequency together as the noise interference of the audio amplifier itself, for example, the buzz sound produced when a mobile phone gets close to a speaker. However, the conventional audio amplifier does not use a fully differential architecture to increase the common mode rejection ratio.

SUMMARY OF THE INVENTION

The present invention is directed to providing a power amplifier with noise shaping function, so as to achieve a maximum signal to noise ratio (SNR) for the amplifier. The present invention uses a delta-sigma circuit to connect a $2^{nd}$-order (or more) integrator in series, to achieve a preferred effect in reducing the off band noise, and replaces the manner for a conventional audio amplifier to dispose a filter in the feedback circuit. Moreover, a common mode input signal is further used to replace the conventional single-end input signal, and a fully differential architecture is used to increase the common mode rejection ratio and enhance the capability of the circuit for resisting the radio frequency interference.

The present invention provides a power amplifier with noise shaping function. The power amplifier comprises a differential mode integrator, an integration and adjustment unit and a switch unit. The differential mode integrator is used for receiving a differential mode input signal and a differential mode output signal, and performing an integration operation to generate a differential mode first signal. The integration and adjustment unit is coupled to the differential mode integrator for receiving the first signal and an output signal, and then performing an integration operation to adjust the first signal into a single-end mode second signal. The second signal is inputted into the switch unit. The working state of the switch unit is determined in accordance with the second signal, and the switch unit outputs the differential mode output signal to drive the load.

The present invention uses a fully differential mode design, which uses a common mode input signal instead of a conventional single-end input signal to increase the common mode rejection ratio, so as to eliminate the common mode noises and improve the capability of the circuit for resisting the radio frequency interference. Moreover, the differential mode integrator and the integration and adjustment unit both comprises a delta-sigma circuit, and they are connected with each other to form a $2^{nd}$-order high-pass filter circuit, which achieves a stronger rejection effect of the off band noise than the conventional combination of a negative feedback circuit and a filter, so that a better filtering effect is achieved and a preferred SNR is obtained. However, the present invention is not limited to this, persons of ordinary skill in the art may serially connect more integrating circuits to form a $3^{rd}$-order filter circuit, according to the actual requirement.

In order to make the aforementioned and other objectives, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A class-D audio power amplifier is taken as an example below in an embodiment of the present invention. However, the present invention is not limited to this, and persons of ordinary skill in the art can apply it in various power amplifiers, such as class-A, class-B, class-AB power amplifiers, according to the spirit of the present invention.

Figure 1:
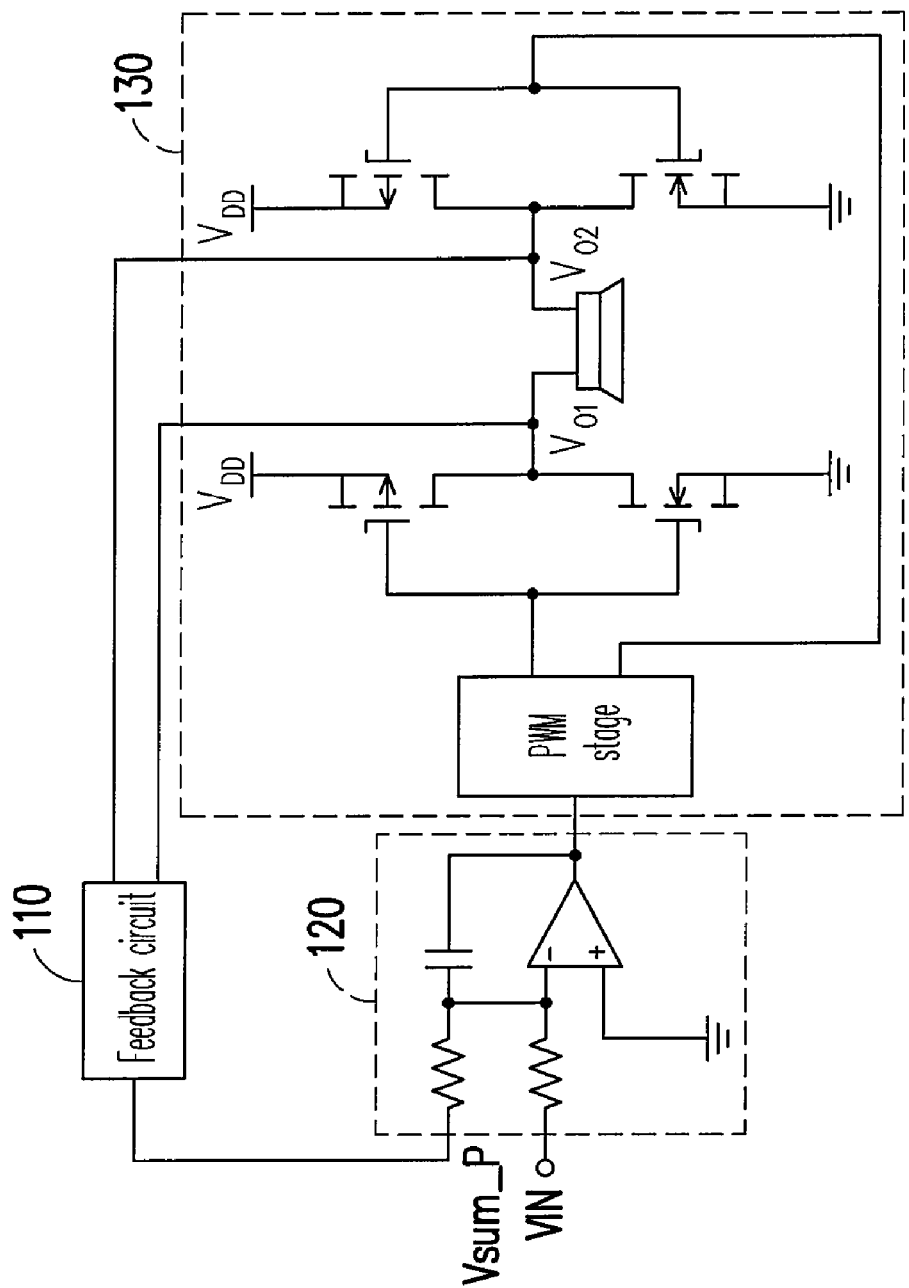
FIG. 1 is a circuit diagram of an audio amplifier in a conventional art.
Figure 2:
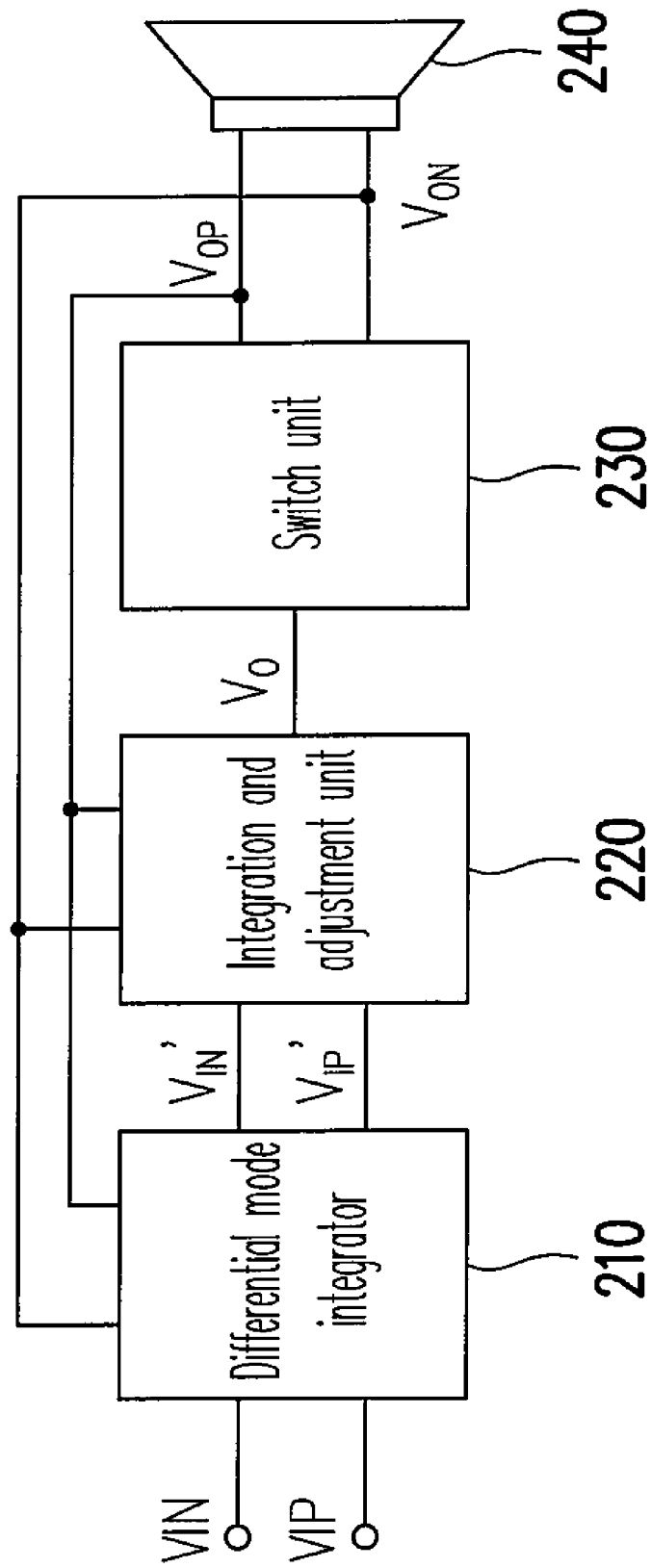
FIG. 2 is a circuit diagram of a power amplifier with noise shaping function according to an embodiment of the present invention.

FIG. 2 is a circuit diagram of a power amplifier with noise shaping function according to an embodiment of the present invention. Referring to FIG. 2, the power amplifier includes a differential mode integrator 210, an integration and adjustment unit 220 and a switch unit 230. The differential mode integrator 210 performs an integration operation on the received audio signals (the differential mode input signals VIN and VIP herein) and differential mode input signals VON and VOP, so as to generate first signals VIN' and VIP'. The integration and adjustment unit 220 receives the differential mode first signals VIN' and VIP' and differential mode output signals VON and VOP, and performs an integration operation. Moreover, the integration and adjustment unit 220 further adjusts the first signals VIN' and VIP' into a single-end mode second signal Vo, and outputs the second signal Vo to the switch unit 230. The working state of the switch unit 230 is determined in accordance with the second signal Vo, and the switch unit 230 outputs the differential mode output signals VON and VOP to drive the load 240. In this embodiment, the load 240 is a speaker or another load.

Figure 3:
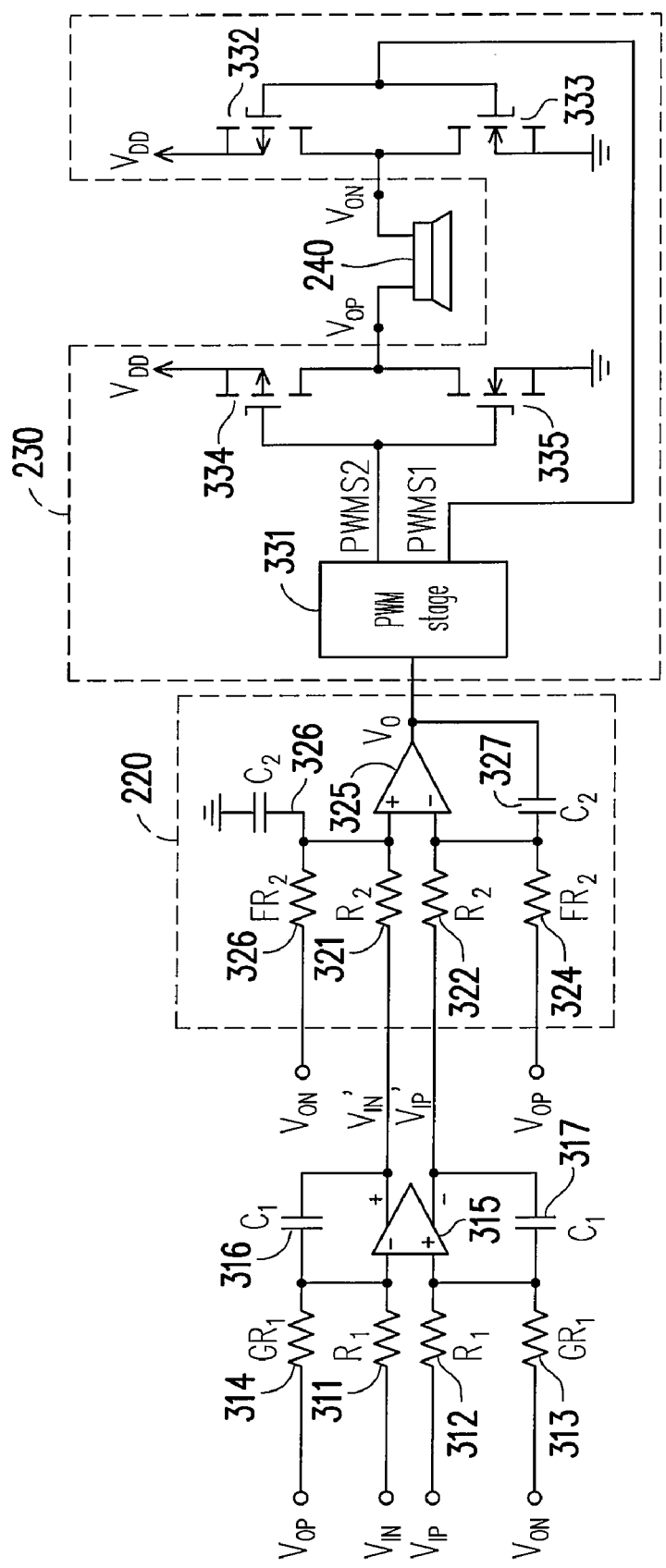
FIG. 3 is a circuit diagram of the power amplifier in FIG. 2 according to an embodiment of the present invention.

FIG. 3 shows an embodiment of the power amplifier in FIG. 2 of the present invention. Referring to FIG. 3, the differential mode integrator 210 includes a first resistor 311, a second resistor 312, a third resistor 313, a fourth resistor 314, a first operational amplifier 315, a first capacitor 316 and a second capacitor 317.

The first terminals of the resistors 311 and 312 respectively receive a first-end signal VIN and a second-end signal VIP of the input signal. The first terminals of the resistors 314 and 312 respectively receive a first-end signal VON and a second-end signal VOP of the output signal. The first operational amplifier 315 has a first input terminal (for example, a positive input terminal) coupled to a second terminal of the second resistor 312 and a second terminal of the third resistor 313, and has a second input terminal (for example, a negative input terminal) coupled to a second terminal of the first resistor 311 and a second terminal of the fourth resistor 314. The first output terminal (for example, a positive output terminal) and the second output terminal (for example, a negative output terminal) of the first operational amplifier 315 respectively output the first-end signal VIN' and the second-end signal VIP' of the first signal. A first terminal and a second terminal of the first capacitor 316 are respectively coupled to the first output terminal and the second input terminal of the first operational amplifier 315. A first terminal and a second terminal of the second capacitor 317 are respectively coupled to the second output terminal and the first input terminal of the first operational amplifier 315. Therefore, a differential input and output integrating circuit is formed. Persons of ordinary skill in the art can adjust the resistance value of the resistors 311-314 and the capacitance value of the capacitors 316-317, i.e., adjust the impedance match, so as to control the low-pass bandwidth of the differential mode integrator 210. In this embodiment, the resistance value of the first resistor 311 and the second resistor 312 is, for example, $R_1$, and the resistance value of the third resistor 313 and the fourth resistor 314 is, for example, $G*R_1$ (G and $R_1$ are real numbers). The capacitance value of the first capacitor 316 and the second capacitor 317 is, for example, C1 (C1 is a real number).

The integration and adjustment unit 220 includes a first impedance device 321, a second impedance device 322, a third impedance device 323, a fourth impedance device 324, a second operational amplifier 325, a fifth impedance device 326 and a sixth impedance device 327. The first terminals of the impedance devices 321 and 322 are respectively coupled to the first output terminal and the second output terminal of the differential mode integrator 210 for receiving the first-end signal VIN' and the second-end signal VIP' of the first signal. The first terminal of the third impedance device 323 receives the first-end signal VON of the output signal. The first terminal of the fourth impedance device 324 receives the second-end signal VOP of the output signal. The second operational amplifier 325 has a first input terminal (for example, a positive input terminal) coupled to the second terminals of the first impedance device 321 and the third impedance device 323, and has a second input terminal (for example, a negative input terminal) coupled to the second terminals of the second impedance device 322 and the fourth impedance device 324. The output terminal of the first operational amplifier 315 outputs a single-end mode second signal Vo. A first terminal of the fifth impedance device 326 is coupled to a first input terminal of the second operational amplifier 325, and the second terminal receives a first voltage. In this embodiment, the above first voltage is, for example, a ground voltage. A first terminal and a second terminal of the sixth impedance device 327 are respectively coupled to the output terminal and the second input terminal of the second operational amplifier 325.

Persons of ordinary skill in the art can implement the first impedance device to the sixth impedance device in any way according to the actual demand, and determine the impedance value of the impedance devices, so as to obtain the required circuit characteristics according to the actual demand. In this embodiment, the first impedance device 321 and the second impedance device 322 are all implemented as a resistor with a resistance value of $R_2$, and the third impedance device 323 and the fourth impedance device 324 are all implemented as a resistor with a resistance value of $F*R_2$ (F is a real number). Moreover, in this embodiment, the fifth impedance device 326 and the sixth impedance device 327 are all implemented as a capacitor with a capacitance value of $C_2$. The first voltage is a reference voltage level, which includes a ground voltage, a level voltage adopted by the frame grounding or according to the actual design requirement.

The switch unit 230 includes a pulse width modulation (PWM) stage 331 and a bridge circuit. The PWM stage 331 is used for generating at least a PWM signal (a first PWM signal PWMS1 and a second PWM signal PWMS2 in this embodiment). The PWM stage 331 modulates the pulse widths of the PWM signals PWMS1 and PWMS2 in accordance with the single-end mode second signal Vo. A class-D output amplification stage is taken as, but not limited to, an example for the bridge circuit in this embodiment. The bridge circuit includes a plurality of switches (a first switch 332, a second switch 333, a third switch 334, and a fourth switch 335 in this embodiment) controlled by the PWM signals PWMS1 and PWMS2. In the bridge circuit, a first terminal of the first switch 332 receives a second voltage (e.g., a power supply voltage VDD), and a second terminal outputs the first-end signal VON of the output signal to a first terminal of the load 240. A first terminal of the second switch 333 receives a third voltage (e.g., a ground voltage), and a second terminal is coupled to the first terminal of the load 240. The switches 332 and 333 are all controlled by the first PWM signal PWMS1.

A first terminal of the third switch 334 receives a second voltage, and a second terminal outputs the second-end signal VOP of the output signal to a second terminal of the load 240. A first terminal of the fourth switch 335 receives a third voltage, and a second terminal is coupled to the second terminal of the load 240. The switches 334 and 335 are all controlled by the second PWM signal PWMS2.

In this embodiment, the above first switch 332 and the third switch 334 are a P-type transistor, and the second switch 333 and the fourth switch 335 are an N-type transistor, and the four switches form a class-D output amplification stage. The PWM stage 331 controls the switches 332-335 of the bridge circuit by modulating the pulse width and phase of the PWM signals PWMS1 and PWMS2. Therefore, the switch unit 230 outputs an audio signal (i.e., output signals VON and VOP) in accordance with the second signal Vo to drive the load 240. In this embodiment, the second voltage is a power supply voltage, which indicates the voltage for driving the output amplification stage, and it is not limited to the power supply voltage of the whole circuit. The third voltage is also a voltage reference level, which is not limited to the ground voltage.

In this embodiment, after being processed through two layers of integrator, the differential input signal forms an output signal $Vo=(Vip-Vin)/\{S^2R^2C^2+SRC/F+1/G\}+ S^2R^2C^2*(THD+Noise)/\{S^2R^2C^2+SRC/F+1/G\}$, wherein, $S=j\Omega=j2\pi f$, f indicates the frequency. The THD in the above formula indicates total harmonic distortion, which is calculated by dividing the root mean square (rms) of the output signal harmonic component by the basic harmonic, so as to indicate a percentage of the basic harmonic root mean square. An evaluation on the output design is usually based upon the THD parameter. Usually, the THD of a high-fidelity audio amplifier has a stage of about less than one percentage. Based on the above formula, in the audio signal, SRC<<1, the noise is greatly reduced to obtain a preferable SNR.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims and their equivalents.

What is claimed is:

1. A power amplifier for generating a differential mode output signal according to a received differential mode input signal to drive a load, comprising:
   a differential mode integrator, receiving the differential mode input signal and the differential mode output signal and performing an integration operation to output a differential mode first signal;
   an integration and adjustment unit, receiving the differential mode first signal and the differential mode output signal and performing an integration operation to adjust the differential mode first signal to a single-end mode second signal; and
   a switch unit, coupled to the differential mode integrator and the integration and adjustment unit, wherein the working state of the switch unit is in accordance with the second signal outputted from the integration and adjustment unit, and the switch unit outputs the differential mode output signal to drive the load.

2. The power amplifier of claim 1, wherein the differential mode integrator comprises:
   a first resistor, having a first terminal coupled to receive a first-end signal of the input signal;
   a second resistor, having a first terminal coupled to receive a second-end signal of the input signal;
   a third resistor, having a first terminal coupled to receive a first-end signal of the output signal;
   a fourth resistor, having a first terminal coupled to receive a second-end signal of the output signal;
   a first operational amplifier, having a first input terminal coupled to the second terminal of the second resistor and the second terminal of the third resistor, a second input terminal coupled to the second terminal of the first resistor and the second terminal of the fourth resistor, and a first and second output terminal respectively outputting the first-end signal and the second-end signal of the first signal;
   a first capacitor, coupled between the first output terminal and the second input terminal of the first operational amplifier; and
   a second capacitor, coupled between the second output terminal and the first input terminal of the first operational amplifier.

3. The power amplifier of claim 2, wherein the first resistor and the second resistor have the same resistance value.

4. The power amplifier of claim 2, wherein the third resistor and the fourth resistor have the same resistance value.

5. The power amplifier of claim 2, wherein the first capacitor and the second capacitor have the same capacitance value.

6. The power amplifier of claim 1, wherein the integration and adjustment unit comprises:
   a first impedance device, having a first terminal coupled to receive the first-end signal of the first signal;
   a second impedance device, having a first terminal coupled to receive the second-end signal of the first signal;
   a third impedance device, having a first terminal coupled to receive the first-end signal of the output signal;
   a fourth impedance device, having a first terminal coupled to receive the second-end signal of the output signal;
   a first operational amplifier, having a first input terminal coupled to the second terminal of the first impedance device and the second terminal of the third impedance device, a second input terminal coupled to the second terminal of the second impedance device and the second terminal of the fourth impedance device, and an output terminal outputting the single-end mode second signal;
   a fifth impedance device, having a first terminal coupled to the first input terminal of the second operational amplifier, and a second terminal coupled to receive a first voltage; and
   a sixth impedance device, having a first and second terminal respectively coupled to the output terminal and the second input terminal of the second operational amplifier.

7. The power amplifier of claim 6, wherein the first impedance device, the second impedance device, the third impedance device, and the fourth impedance device are resistors.

8. The power amplifier of claim 7, wherein the first impedance device and the second impedance device have the same impedance value.

9. The power amplifier of claim 7, wherein the third impedance device and the fourth impedance device have the same impedance value.

10. The power amplifier of claim 6, wherein the fifth impedance device and the sixth impedance device are capacitors.

11. The power amplifier of claim 10, wherein the fifth impedance device and the sixth impedance device have the same capacitance value.

12. The power amplifier of claim 6, wherein the first voltage comprises the ground voltage.

13. The power amplifier of claim 1, wherein the switch unit comprises:
   a pulse width modulation (PWM) stage, generating at least a PWM signal having a pulse width modulated in accordance with the single-end mode second signal; and
   a bridge circuit, having a plurality of switches controlled by the PWM signal.

14. The power amplifier of claim 13, wherein the pulse width modulation (PWM) stage generates a first and second PWM signal having pulse widths modulated in accordance with the single-end mode second signal.

15. The power amplifier of claim 14, wherein the bridge circuit comprises:
   a first switch, having a first terminal coupled to receive a second voltage and a second terminal coupled to a first terminal of the load, and controlled by the first PWM signal;

a second switch, having a first terminal coupled to receive a third voltage and a second terminal coupled to the first terminal of the load, and controlled by the first PWM signal;

a third switch, having a first terminal coupled to receive the second voltage and a second terminal coupled to a second terminal of the load, and controlled by the second PWM signal; and a fourth switch, having a first terminal coupled to receive the third voltage and a second terminal coupled to the second terminal of the load, and controlled by the second PWM signal.

16. The power amplifier of claim 15, wherein the first switch and the third switch are P-type transistors, while the second switch and the fourth switch are N-type transistors.

* * * * *